(12) United States Patent
Jaakkola et al.

(10) Patent No.: US 12,184,262 B2
(45) Date of Patent: *Dec. 31, 2024

(54) MEMS RESONATOR

(71) Applicant: KYOCERA TECHNOLOGIES OY, Espoo (FI)

(72) Inventors: Antti Jaakkola, Espoo (FI); Panu Koppinen, Espoo (FI)

(73) Assignee: KYOCERA TECHNOLOGIES OY, Espoo (FI)

(*) Notice: Subject to any disclaimer, the term of this patent is extended or adjusted under 35 U.S.C. 154(b) by 0 days.

This patent is subject to a terminal disclaimer.

(21) Appl. No.: 18/463,672

(22) Filed: Sep. 8, 2023

(65) Prior Publication Data

US 2024/0007077 A1 Jan. 4, 2024

Related U.S. Application Data

(63) Continuation of application No. 17/600,445, filed as application No. PCT/FI2020/050236 on Apr. 9, 2020, now Pat. No. 11,799,441.

(30) Foreign Application Priority Data

Apr. 12, 2019 (FI) ........................ 20195302

(51) Int. Cl.
*H03H 9/02* (2006.01)
*B81B 7/00* (2006.01)
*H03H 9/24* (2006.01)

(52) U.S. Cl.
CPC ....... *H03H 9/02338* (2013.01); *B81B 7/0009* (2013.01); *H03H 9/2447* (2013.01); *H03H 2009/02291* (2013.01)

(58) Field of Classification Search
CPC ............ H03H 9/02338; H03H 9/2463; H03H 9/02433; H03H 9/505; H03H 9/02244;
(Continued)

(56) References Cited

U.S. PATENT DOCUMENTS 7,806,586 B2* 10/2010 Melamud ................ G01L 19/04
374/117
11,799,441 B2* 10/2023 Jaakkola ............... B81B 7/0009
(Continued)

FOREIGN PATENT DOCUMENTS

EP       1770859 A1    4/2007
JP    H04242310 A     8/1992
(Continued)

OTHER PUBLICATIONS

Japan Patent Office, Office Action, Application No. 2021-559716, mailed Jan. 24, 2024, 7 pages.
(Continued)

*Primary Examiner* — Jeffrey M Shin
(74) *Attorney, Agent, or Firm* — Ziegler IP Law Group LLC (57) ABSTRACT

A microelectromechanical (MEMS) resonator includes a resonator structure having a plurality of beam elements and connection elements with certain geometry, where the plurality of beam elements are positioned adjacent to each other and adjacent beam elements are mechanically connected to each other by the connection elements, where the geometry of the beam elements or the connection elements varies within the resonator structure.

21 Claims, 8 Drawing Sheets

(58) Field of Classification Search
CPC .. H03H 2009/02291; H03H 2009/0244; B81B 7/0009; B81B 7/00
See application file for complete search history.

(56) References Cited

U.S. PATENT DOCUMENTS

2006/0125576 A1\*   6/2006   Ho ..................... H03H 9/02338
                                                         333/186
2019/0376789 A1    12/2019   Soejima et al.

FOREIGN PATENT DOCUMENTS

| | | |
|---|---|---|
| JP | 2003023337 A | 1/2003 |
| JP | 2006005758 A | 1/2006 |
| JP | 2011135140 A | 7/2011 |
| JP | 2012105044 A | 5/2012 |
| JP | 2017536012 A | 11/2017 |
| WO | 2016051022 A1 | 4/2016 |
| WO | 2018139296 A1 | 8/2018 |

OTHER PUBLICATIONS

Japan Patent Office, Notice of Allowance, Japanese Patent Application No. 2021-559716, Dated Jul. 8, 2024, 3 Pages.

\* cited by examiner

MEMS RESONATOR

FIELD

The aspects of the disclosed embodiments generally relate to microelectromechanical (MEMS) resonators.

BACKGROUND

This section illustrates useful background information without admission of any technique described herein representative of the state of the art.

A key performance parameter in microelectromechanical (MEMS) resonators such as silicon MEMS resonators used for frequency reference applications is the equivalent series resistance (ESR). ESR is inversely proportional to the quality factor Q of the resonator, and thus the maximization of this parameter is often desirable. Anchoring, i.e., attaching the resonator to its surrounding substrate, is typically very critical for the maximization of the Q factor of a MEMS resonator.

SUMMARY

It has been observed that it is desired to anchor the resonator in such a way that the anchoring point(s) coincide with nodal point(s) of the resonance mode shape. A desired property of a resonator and of its mode shape is that nodal point(s) exist at the edge of the resonator, since the anchoring typically takes place by silicon tethers connected to the edge of the resonator.

Further, it has been observed that another factor which may contribute to energy losses and which thereby decreases the Q factor of the resonator is damping due to a gas atmosphere surrounding the resonator.

A stacked beam resonator comprises a plurality of resonator beams positioned side-by-side in a plane, separated by trenches and connected by connection elements.

The aspects of the disclosed embodiments are generally directed to optimizing the geometry of tacked beam resonators.

According to a first example aspect of the disclosed embodiments there is provided a microelectromechanical resonator, comprising:

a resonator structure having a plurality of beam elements and connection elements with certain geometry, where the plurality of beam elements are positioned adjacent to each other and adjacent beam elements are mechanically connected to each other by the connection elements, where the geometry of the beam elements or the connection elements varies within the resonator structure.

In certain embodiments, the geometry is varied by varying at least one dimensioning parameter of the resonator. In certain embodiments, the variation of the geometry of the beam elements and/or the connection elements is to provide nodal point(s) of resonance mode shape(s) concerned at resonator perimeter. In certain embodiments, the nodal point(s) coincide with an anchoring point or anchoring points (anchoring the beam elements to surroundings), or are relatively close to the anchoring point(s).

Herein, the at least one dimensioning parameter is for example a parameter or a set of parameters (comprising at least two parameters) that define for example the shape, orientation or dimension(s) of the beam elements and/or their mechanical connection to each other.

A stacked beam resonator conventionally has a basic geometry in which beam elements with equal width are connected by rectangular connection elements that are positioned at resonator edges. Embodiments of the present disclosure deviate from this basic geometry.

In certain embodiments, a beam element differs in width from another beam element. The beam elements have their respective widths, and in certain embodiments the width of at least one beam element (or a plurality of beam elements) differs from the width of another beam element.

In certain embodiments, a beam element differs in shape from another beam element. The beam elements have their respective shape, and in certain embodiments the shape of at least one beam element (or a plurality of beam elements) differs from the shape of another beam element.

In certain embodiments, a beam element differs in tilting angle (orientation) from another beam element. In such an embodiment, at least two adjacent beam elements are positioned at an oblique angle with respect to each other. In certain embodiments, the tilting of adjacent beam elements occurs in the plane of the resonator ("in-plane tilting").

In certain embodiments, a beam element differs in its longitudinal position within the resonator structure from another beam element. In such an embodiment, the longitudinal positions of at least two adjacent beam elements differ from each other.

In certain embodiments, a connection element differs in its shape from another connection element.

In certain embodiments, a connection element (or at least one connection element, or a plurality of connection elements) differs from another connection element in its displacement from resonator edge.

In certain embodiments, the width of at least one beam element differs from the width of another beam element and at least one of the connection elements connecting adjacent beam elements is spaced a distance apart from respective ends of the adjacent beam elements concerned (or at least from the end of one of said adjacent beam elements, the end that is closer to the connection element in question).

In certain embodiments, the width of an outermost beam element is smaller than the width of its (immediately) adjacent beam element.

In certain embodiments, the resonator comprises a trench extending from a resonator edge to inside of the resonator structure until it reaches an edge of one of the connection elements. In certain embodiments, the trench is straight in its shape.

In certain embodiments, the resonator comprises n adjacent beam elements where the first and nth beam element have a width that is different from the width of the other beam elements, and connection elements in between the first and the second as well as in between the (n−1)th and the nth beam element are spaced a distance apart from respective ends of the beam elements.

In certain embodiments, the resonator structure is formed of the plurality of beam elements and connection elements.

In certain embodiments, the resonator is configured to operate in an in-plane length extensional (LE) mode. In certain embodiments, the beam elements of the resonator are configured to operate in an in-plane length extensional mode.

In certain embodiments, the widths of the beam elements are averaged widths, or effective widths. In certain embodiments, the plurality of beam elements have their respective lengths. In certain embodiments, the lengths are averaged lengths, or effective lengths. In certain embodiments, the beams elements are longer than they are wide.

In certain embodiments, the coordinate system is selected so that the x-axis resides in the width direction of the beam elements and the y-axis in the longitudinal direction of the beam elements. The beam elements (and thus the whole resonator) oscillate in the LE-mode in the direction of the y-axis.

In certain embodiments, the beam elements are of an elongated shape (having their length longer that their width). They may be, for example, of a rectangular shape, rounded rectangular shape, rounded elliptical shape, an hourglass shape, a tapered shape, a rotated hourglass shape, or a non-symmetric elongated shape. In certain embodiments, the shape (or form) of one of more of the beam elements is different from the shape of another of the beam elements.

In certain embodiments, at least one connection element differs from another connection element. In certain embodiments, the difference is in shape, size, position and/or orientation.

In certain embodiments, the resonator structure having the plurality of beam elements and the connection elements is a symmetric structure. In certain embodiments, the resonator structure has reflection symmetry. In certain embodiments, the resonator structure has mirror symmetry. In certain embodiments, the mirror symmetry is with respect to x-axis and/or y-axis (the directions of the axes are defined later in the description). In certain embodiments, the intersection of the x-axis and y-axis is in the center of mass of the resonator structure. In certain embodiments, the resonator structure has rotational symmetry. In certain embodiments, the rotational symmetry is 2-fold rotational symmetry.

In certain embodiments, the resonator structure comprises asymmetry in the form of at least one of the connection elements being asymmetrically positioned.

In certain embodiments, the general structure of the resonator is symmetric, but the structure comprises a specific detail, such as the mentioned asymmetrically placed connection element, that breaks symmetry.

In certain embodiments, the resonator comprises semiconducting material. In certain embodiments, the resonator comprises silicon. In certain embodiments, the resonator comprises degenerately doped silicon. In certain embodiments, more than 50% of the resonator mass consists of degenerately doped silicon. In certain embodiments, the resonator comprises a body of silicon doped to an average impurity concentration of at least $2*10^{19}$ cm$^{-3}$, such as at least $10^{20}$ cm$^{-3}$.

In certain embodiments, the resonator is configured to be actuated piezoelectrically or electrostatically.

In certain embodiments, the longitudinal axis of a beam element (or all beam elements) is aligned with crystal direction of the beam element, or deviates less than 25 degrees therefrom. In certain preferable embodiments, the longitudinal axis of a beam element (or all beam elements) is aligned with crystal direction of the beam element, or deviates less than 15 degrees therefrom. In certain preferable embodiments, the longitudinal axis of a beam element (or all beam elements) is aligned with crystal direction of the beam element, or deviates less than 5 degrees therefrom. In certain preferable embodiments, the longitudinal axis of a beam element (or all beam elements) is aligned with crystal direction of the beam element, or deviates less than 2 degrees therefrom.

In certain embodiments, the microelectromechanical resonator is a stacked beam resonator. In certain embodiments, the beam elements are positioned in a rectangular array configuration. In certain embodiments, a main resonance mode shape of the resonator has nodal point(s) at the resonator perimeter. In certain embodiments, the resonator comprises an anchoring point to anchor beam elements to surroundings, where the main resonance mode shape of the resonator has a nodal point at the anchoring point. In certain embodiments, the resonance mode refers to a fundamental mode. In certain embodiments, the resonance mode refers to an overtone.

In certain embodiments, the width, longitudinal placement, or orientation of at least one beam element differs from the width, longitudinal placement, or orientation, respectively, of another beam element; or at least one of the connection elements connecting adjacent beam elements is spaced a distance apart from at least one respective end of the adjacent beam elements concerned.

In certain embodiments, the resonator comprises a first edge and an opposite edge. In certain embodiments, the displacement from resonator edge means displacement in y-direction and from the resonator edge that is closer to the connection element in question. Similarly, the connection element(s) being spaced a distance apart from respective end(s) of the beam element(s) in certain embodiments means spacing in y-direction from the end or ends of the beam element(s) in question that is (are) closer to the connection element(s) in question.

In certain embodiments, the longitudinal position of the center of mass of adjacent beam elements is different in y-direction. In certain embodiments, the longitudinal position of the beam elements means position in the y-direction.

In certain embodiments, the resonator is a stacked beam resonator, and said plurality of beam elements is positioned in a rectangular array configuration, and wherein the resonator structure comprises a top electrode implemented in a layer on top of a piezoelectric layer.

In certain embodiments, the resonator comprises the width of a trench between edges of the beam elements forming the resonator and a surrounding solidly mounted silicon frame selected to minimize or avoid acoustic resonance at the area of the trench.

In certain embodiments, the width of the trench between the edges of the beam elements forming the resonator and a surrounding solidly mounted silicon frame is given by the equation Trench–Width=4 mm×(40 MHz/Freq)×(n+½) and where "Freq" is the frequency of the resonator, and "n" is a positive integer 0, 1, 2, 3, . . . , or the width of the trench deviates at most 20% from the width given by the said equation.

Different non-binding example aspects and embodiments have been presented in the foregoing. The above embodiments and embodiments described later in this description are used to explain selected aspects or steps that may be utilized in implementations of the present disclosure. It should be appreciated that corresponding embodiments apply to other example aspects as well. Any appropriate combinations of the embodiments can be formed.

BRIEF DESCRIPTION OF THE DRAWINGS

The aspects of the disclosed embodiments will now be described, by way of example only, with reference to the accompanying drawings, in which.

DETAILED DESCRIPTION

In the following description, like numbers denote like elements.

Figure 1:
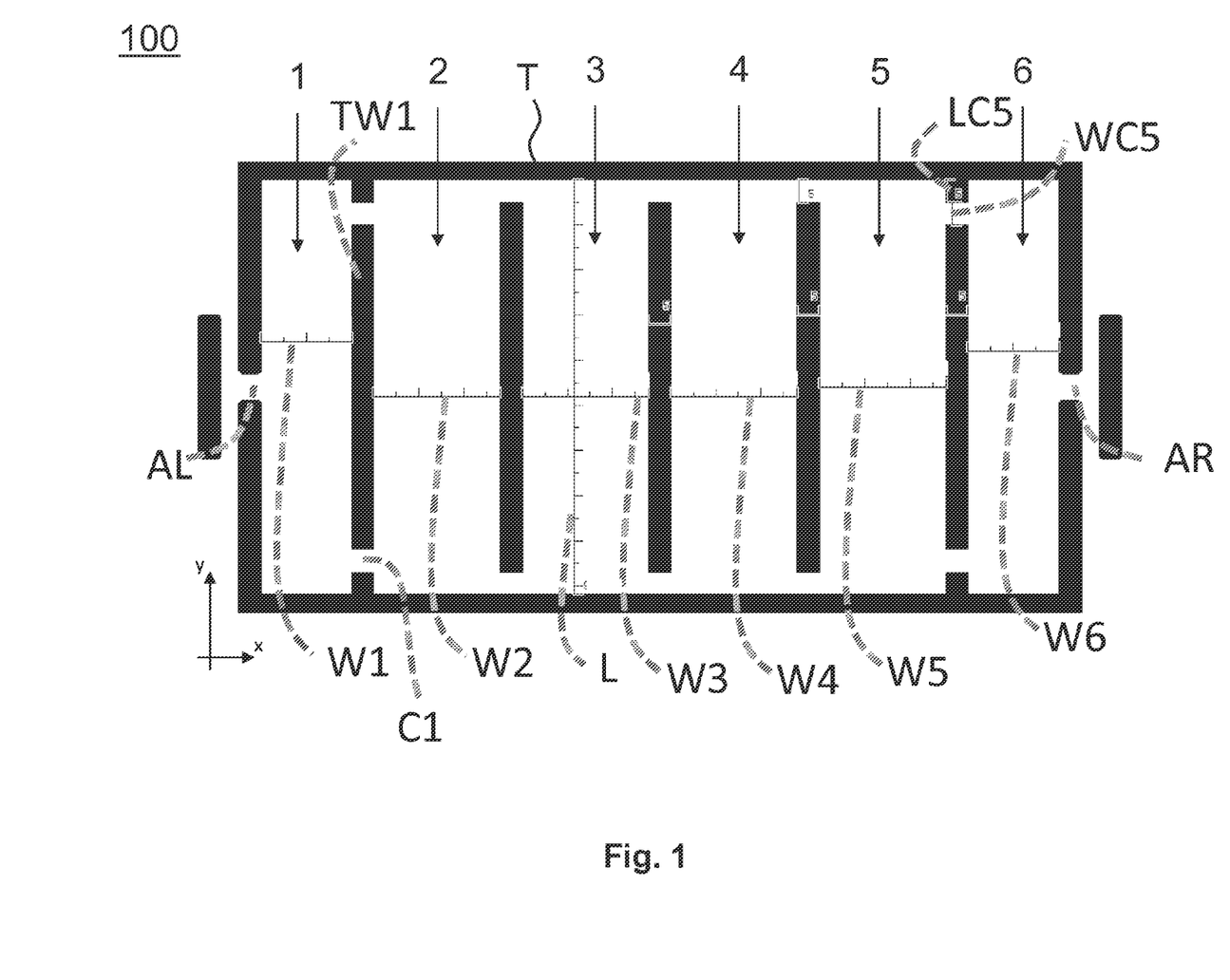
FIG. 1 shows a microelectromechanical (MEMS) resonator in accordance with certain embodiments.

FIG. 1 shows a microelectromechanical (MEMS, microelectromechanical systems) resonator in accordance with certain embodiments. In more detail, FIG. 1 shows a top view of a stacked beam resonator, which comprises six adjacently positioned beam elements 1 . . . 6 with widths W1 . . . W6 and length L. The beam elements 1 . . . 6 are coupled to each other by connecting elements. In the shown embodiment, each two adjacent beam elements are coupled by two connecting elements. One of the connecting elements between the first and second beam elements 1, 2 has been drawn in the figure and denoted by C1 (other connecting elements can be denoted similarly, e.g., the connecting elements connecting beams 2 and 3 are denoted by C2, the connecting elements connecting beams 3 and 4 are denoted by C2, and so on). The connecting elements have widths WC1 . . . WC5 and they are located at a distance LC1 . . . LC5 from the edge of the resonator 100 (concerning a fifth connecting element, the width WC5 and distance LC5 from the edge has been drawn in the figure).

The beam elements 1 . . . 6 are separated from one another by trenches (of rectangular shape in this embodiment). The trench between the beam elements 1 and 2 is denoted by TW1, the trench between the beam elements 2 and 3 by TW2 (not marked in the figure), and so on. A trench separating the whole resonator 100 from its surrounding is denoted by T in the figure. AL and AR denote the left and right anchoring locations, respectively, which are located at the center of the left and right sides of the resonator 100.

The geometry in the figure has parameters L1 . . . L6=91.75 µm, W2 . . . W5=28 µm, TW1 . . . TW5=5 µm, LC2 . . . LC4=0 µm, LC1=LC5=5 µm, WC1 . . . WC5=5 µm.

Figure 2:
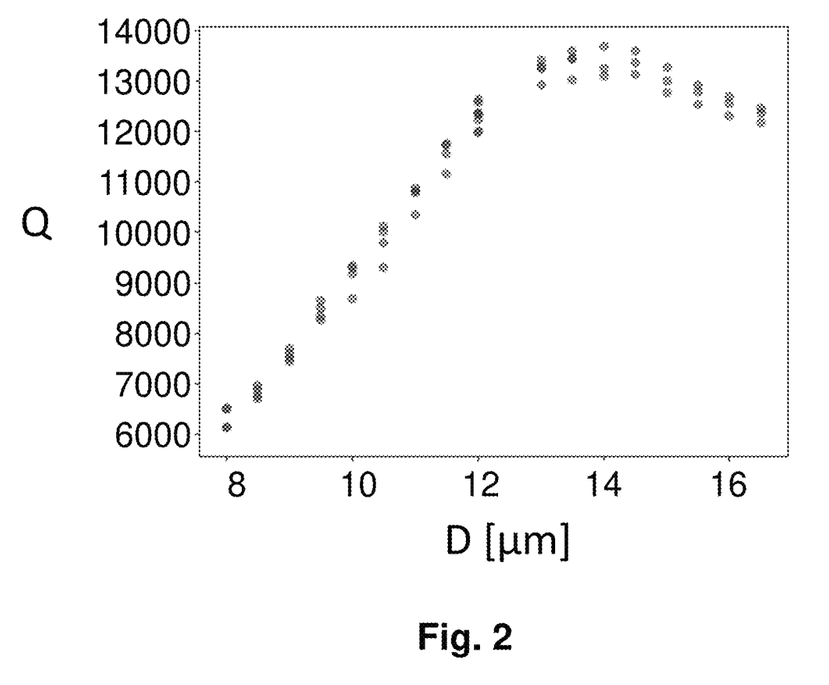
FIG. 2 shows experimental results relating to the MEMS resonator of the type shown in FIG. 1.

FIG. 2 shows experimental results relating to the MEMS resonator of the type shown in FIG. 1. Q factors of 40 MHz parametrically varied resonators fabricated on a silicon wafer were experimentally measured as an example. The silicon wafer normal was in direction and the sides of the resonator beam elements were aligned with <100> directions. A parameter D was varied between 8 . . . 16.5 µm, and approximately 5 resonators were measured for each variation under atmospheric pressure. The resonator design geometry was similar to that described in FIG. 1 except for the variation of beam element widths W1 and W6 according to the formula W1=W6=28 µm–D. Optimal performance was reached at D=14 µm, i.e., at W1=W6=14 µm.

Figure 3:
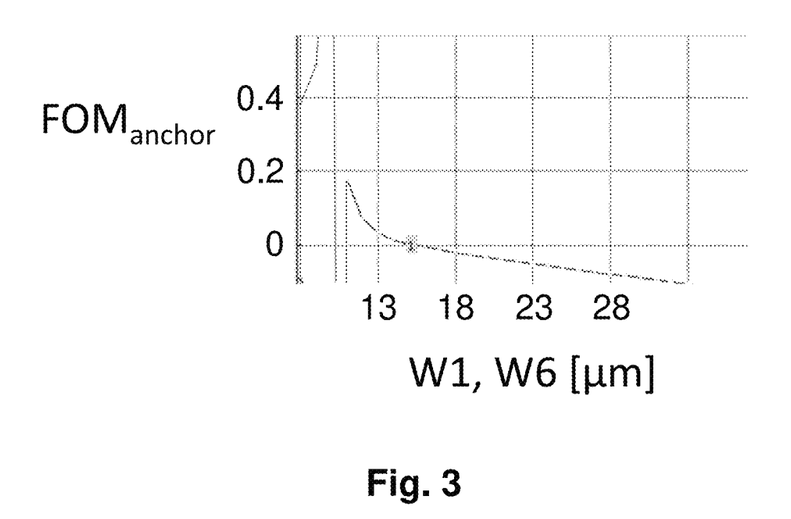
FIG. 3 shows simulation results relating to the MEMS resonator of the type shown in FIG. 1.

FIG. 3 shows simulation results relating to the MEMS resonator of the type shown in FIG. 1. In more detail, FIG. 3 shows the figure-of-merit $FOM_{anchor}$ of the geometries discussed in FIG. 2, calculated with the FEM analysis software COMSOL Multiphysics. $FOM_{anchor}$ is defined as $$FOM_{anchor} = u\_x\_anchor/|max(u\_y\_long\_side)|$$

where u_x_anchor is the x-directed displacement at the right-hand-side anchoring point AR (see FIG. 1) of the resonance mode shape concerned, and max(u_y_long_side) is the maximum y-directed displacement of the resonance mode on the x-directed top edge of the resonator. The optimum, i.e., the location at which $FOM_{anchor}=0$ is close to W1=W6=14 µm, which coincides well with the experimentally found optimum discussed in FIG. 2.

In the disclosed embodiments, the coordinate system is selected so that the x-axis resides in the width direction of the beam elements and the y-axis in the longitudinal direction of the beam elements. The beam elements (and thus the whole resonator) oscillate in the LE-mode in the direction of the y-axis.

As shown in FIGS. 1-3, it is practical to implement a MEMS resonator in which the width of at least one beam element differs from the width of another beam element. Furthermore, it was practical to implement a MEMS resonator in which at least one of the connection elements connecting adjacent beam elements is spaced a distance apart from the ends of the adjacent beam elements (or from the resonator edge). The main resonance mode shape of the resonator had nodal point(s) that appear at the resonator perimeter. In the example shown in FIGS. 1-3 it was optimal that the rightmost and leftmost beam elements had the width that was half the width of the other beam elements with the shown geometry and that the connection elements between the first and the second beam element as well as the connection elements between the fifth and the sixth beam element were spaced apart the same distance from the resonator edge as the trenches between the beam elements were wide. In that way the nodal point(s) of the concerned main resonance mode shape coincided with the anchoring point(s). However, it should be noted that the presented geometry is not the only preferable geometry, but the geometry can be varied and designed depending on the embodiment concerned.

Figure 4A:
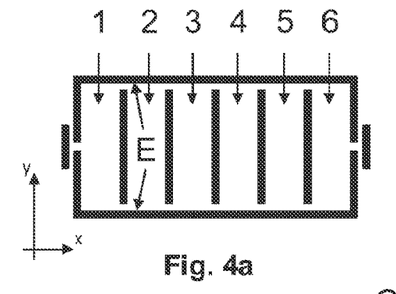
FIGS. 4a-4i show certain alternative resonator geometries in accordance with certain embodiments.

FIGS. 4b-4i show alternative geometries in which it is possible to obtain nodal point(s) at the resonator perimeter, e.g., at anchoring point(s) in the middle of the side edge of the outermost beam elements 1 and 6. FIG. 4a shows a basic geometry with each beam element 1-6 having an equal width and with each connecting element having a zero distance from the concerned resonator edge(s) E.

Figure 4B:
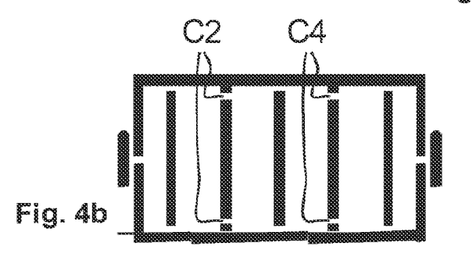

FIG. 4b shows a resonator geometry with widths of beam elements 1 and 6 modified (narrowed in this embodiment) and the connecting elements C2 and C4 in between the beam elements 2 and 3 as well as in between 4 and 5 modified (displaced a distance from the resonator edge E). The modifications are with respect to the basic geometry shown in FIG. 4a.

Figure 4C:
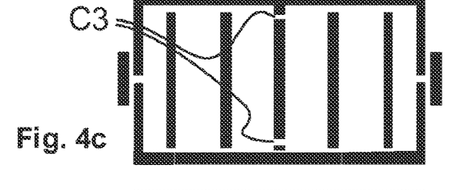

FIG. 4c shows another alternative geometry with widths of beam elements 1 and 6 modified (narrowed in this embodiment) and the connecting element C3 in between the (centermost) beam elements 3 and 4 modified.

Figure 4D:
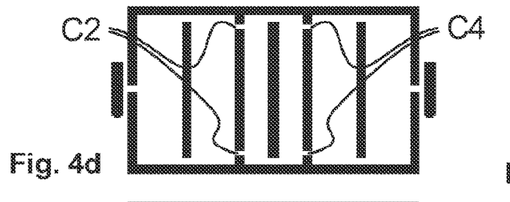

FIG. 4d shows another alternative geometry with widths of (centermost) beam elements 3 and 4 modified (narrowed in this embodiment) and the connecting elements C2 and C4 in between the beam elements 2 and 3 as well as in between 4 and 5 modified.

Figure 4E:
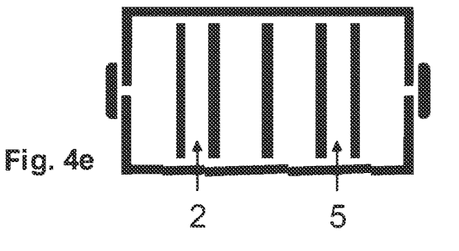

FIG. 4e shows another alternative geometry with widths of beam elements 2 and 5 modified.

Figure 4F:
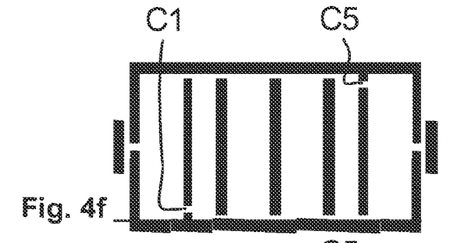

FIG. 4f shows another alternative geometry generally corresponding with the basic geometry shown in FIG. 4e. However, in this embodiment, one of the connecting elements C1 in between the beam elements 1 and 2 and one of the connecting elements C5 in between the beam elements 5 and 6 is modified (displaced a distance from the respective edge E), but the other one is not. The modified connecting element C1 is the one that is closer to one edge E while the modified connecting element C5 is the one that is closer to the other, or opposite, edge E. The geometry shown in FIG. 4f therefore shows reduced symmetry.

Figure 4G:
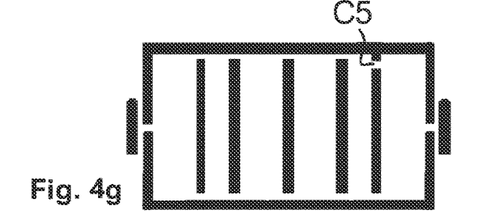

FIG. 4g shows another alternative geometry in which symmetry is yet further reduced compared to the geometry shown in FIG. 4f. While in the geometry shown in FIG. 4f one of the connecting elements C1 in between the beam elements 1 and 2 and one of the connecting elements C5 in between the beam elements 5 and 6 was modified, FIG. 4g shows a geometry in which only one connecting element is modified (here: one of the connecting elements C5).

Figure 4H:
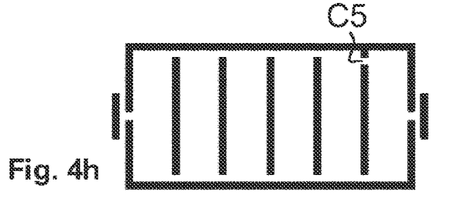

FIG. 4h shows another alternative geometry otherwise corresponding to that of FIG. 4g, except that in the alternative shown in FIG. 4h the widths of each beam element are equal. Accordingly, shown are equal beam elements with only one connecting element modified (displaced from the respective edge E).

Figure 4I:
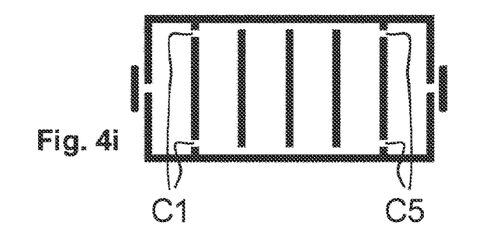

FIG. 4i shows yet another alternative geometry with beam elements having equal widths. In this embodiment, the connecting elements C1 in between the beam elements 1 and 2 and the connecting elements C5 in between the beam elements 5 and 6 are modified (displaced a distance from the respective edge E). The resonator structure formed by the beam elements and the connecting elements therefore is a symmetric structure (equal beam elements with outermost connecting elements symmetrically displaced).

The exact dimensioning in FIGS. 4b-4i depends on the embodiment and the desired position of the nodal point(s) of the main resonance mode shape in question.

Figure 5A:
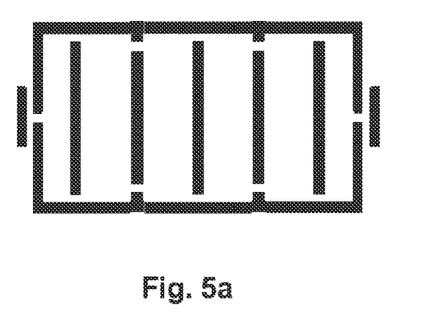
FIGS. 5a and 5b show connecting elements in certain alternative embodiments.
Figure 5B:
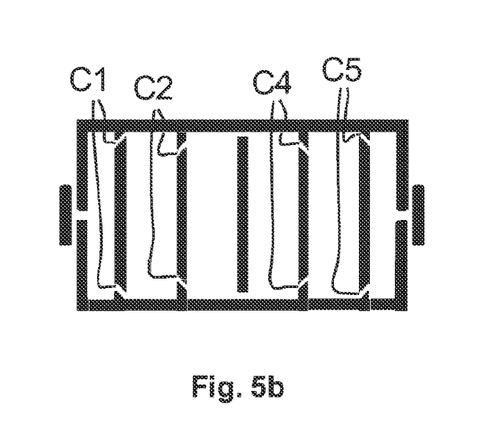

The connection elements between beam elements may be implemented as x-directed rectangles as shown in FIGS. 1-4 and in FIG. 5a. However, the shape of one of more of the connection elements may be different, such as shown in FIG. 5b. The connecting elements C1, C2, C4, and C5 therein have been arranged as inclined elements.

Figure 6:
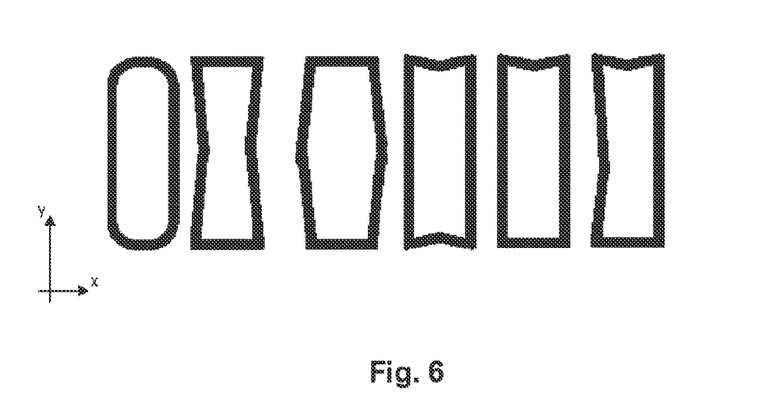
FIG. 6 shows certain alternative beam geometries in accordance with certain embodiments.

Further, instead of being rectangles the beam elements may be of another elongated shape. Elongated geometries support a length extensional (LE) resonance mode so the alternative beam geometries shown as an example in FIG. 6 can be applied as well. Examples of different beam types are: rounded rectangular shape, rounded elliptical shape, an hourglass shape, a tapered shape, a rotated hourglass shape, and non-symmetric elongated shapes. In these embodiments, it may become appropriate when referring to widths and lengths of the beam elements to consider averaged widths (or effective widths) and averaged lengths (or effective lengths).

Figure 7:
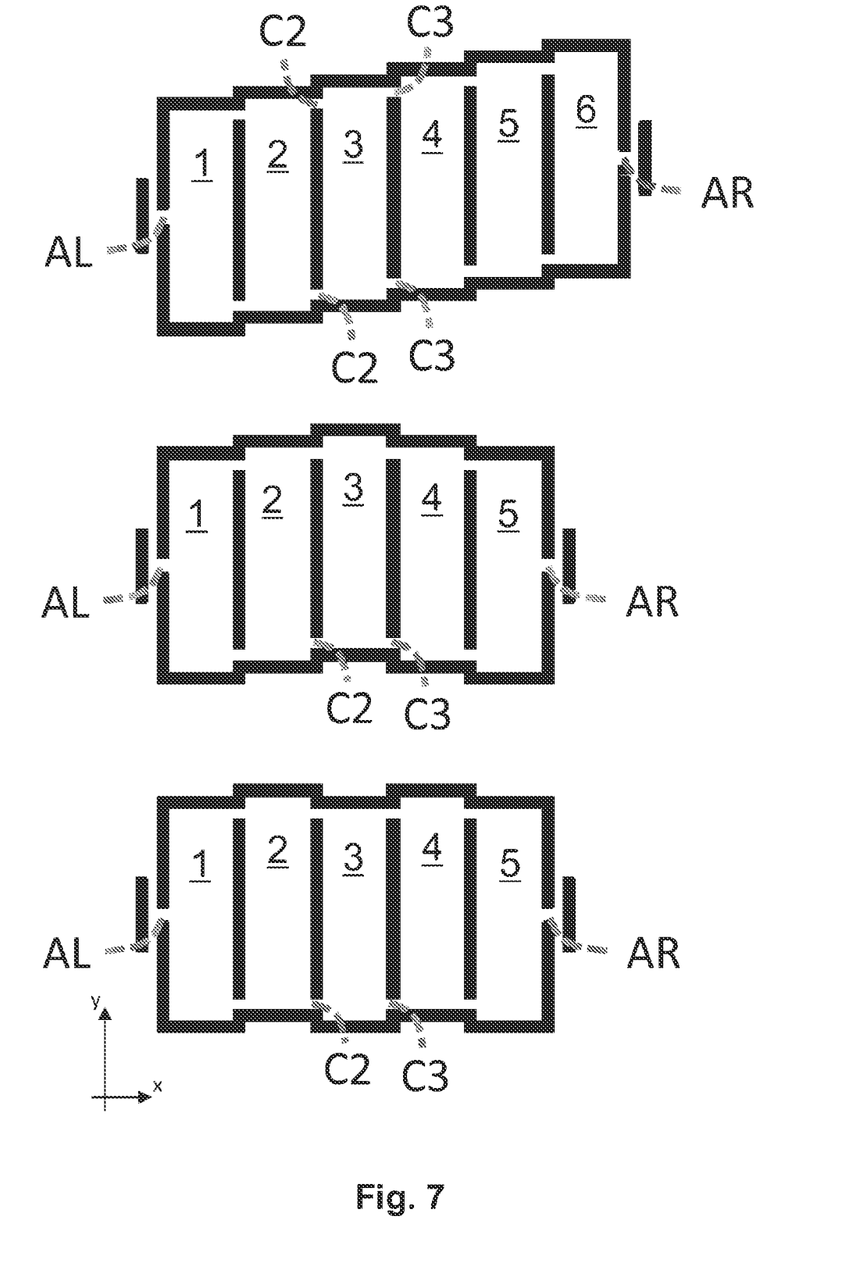
FIG. 7 shows yet certain alternative resonator geometries in accordance with certain embodiments.

FIG. 7 shows yet certain alternative resonator geometries in accordance with certain embodiments. Herein, the center of mass of the different beam elements is varied in the longitudinal direction of the beam elements. Accordingly, the location of the center of mass of the beam elements is not equal in the y-direction.

The uppermost drawing of FIG. 7 presents a geometry in which the center of mass of each subsequent beam element is displaced farther in the longitudinal direction (y-direction) compared to center of mass of the previous beam element.

The drawing in the middle shows a geometry in which the centermost beam element (or its center of mass) is displaced most and the outermost beam elements are least displaced. The lowermost drawing, in turn shows a geometry where the beam elements (or their center of mass) are displaced in an alternating fashion, e.g., by displacing every other beam element. The connection elements shown in FIG. 7 (see e.g. connection elements C2 and C3) connect adjacent beam elements in such a way that they reside at the end of one of the beam elements they connect but are spaced a distance apart from the end of the other.

Figure 8:
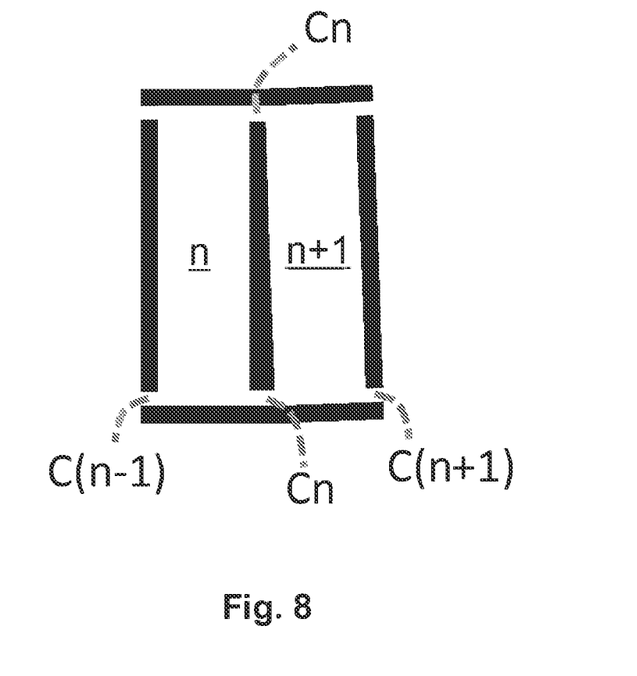
FIGS. 8 and 9 show details in yet other resonator geometries in accordance with certain embodiments.
Figure 9:
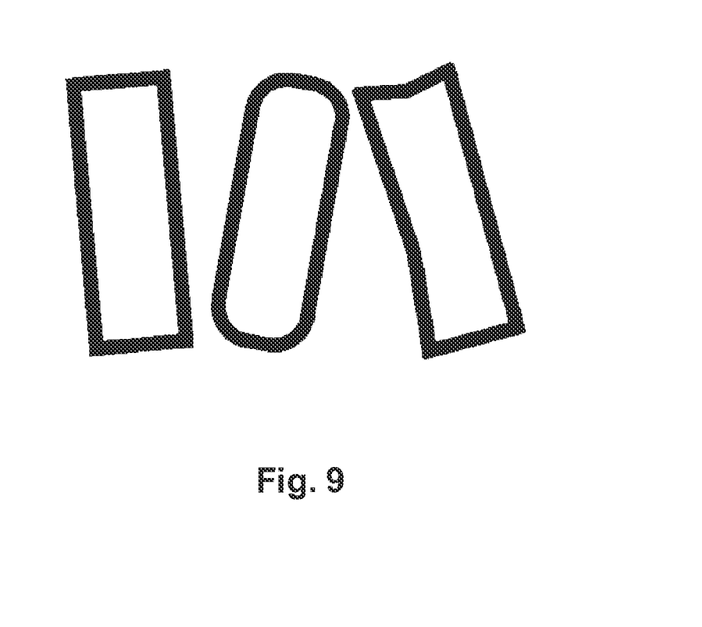

FIGS. 8 and 9 show details in yet other resonator geometries in accordance with certain embodiments. In the embodiment shown in FIG. 8, a beam element differs in tilting angle (orientation) from another beam element. The beam element n is positioned at an oblique angle with respect to an adjacent beam element n+1. The beam elements n and n+1 are connected by connection elements Cn positioned at beam element ends. The dimensions of the connection elements Cn at the ends are slightly different (the other connection element is longer) due to the tilting. Also the trench in between the beam elements n and n+1 is not completely rectangular, but it expands towards one edge of the resonator. The tilting of adjacent beam elements occurs in the plane of the resonator ("in-plane tilting"). In the embodiment shown in FIG. 9 both the shape and tilting angle of adjacent beam elements is varied within the resonator structure. The connection elements have not been drawn in FIG. 9.

The presented resonator structures are suitable to be actuated piezoelectrically or electrostatically depending on the embodiment.

Figure 10:
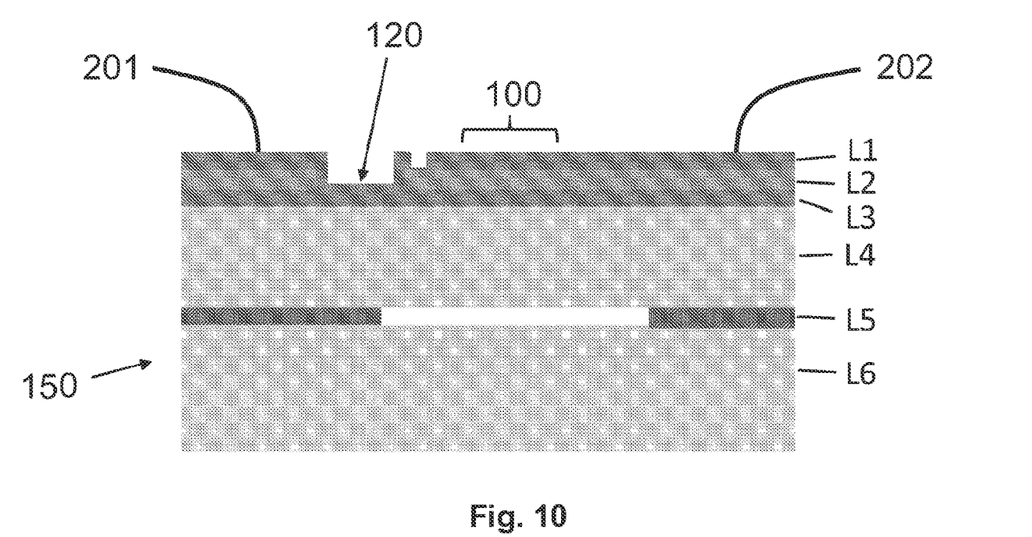
FIG. 10 shows a sectional view of a piezoelectrically actuated resonator in accordance with certain embodiments.

FIG. 10 shows an example cross section for piezoelectric actuation. A silicon on insulator (SOI) wafer 150 is applied. The reference numerals 201 and 202 denote bottom electrode and top electrode contacts, respectively. The top electrode is implemented in layer L1. Layer L2 is a piezoelectric layer for piezoelectric actuation of the resonator residing in the area of denoted by 100. An opening in L2 is denoted by 120. Layer L3 denotes a layer for the bottom electrode. Layer L4 is a doped silicon layer for the resonator body (beam elements and their connecting elements). Layer L5 is a buried oxide layer of the SOI wafer, and layer L6 is a silicon handle layer. In certain embodiments, when the doped silicon layer is used as L4, it is possible to leave out the separate L3 bottom electrode layer. In such embodiments, the conductive doped silicon layer acts as the bottom electrode.

Figure 11:
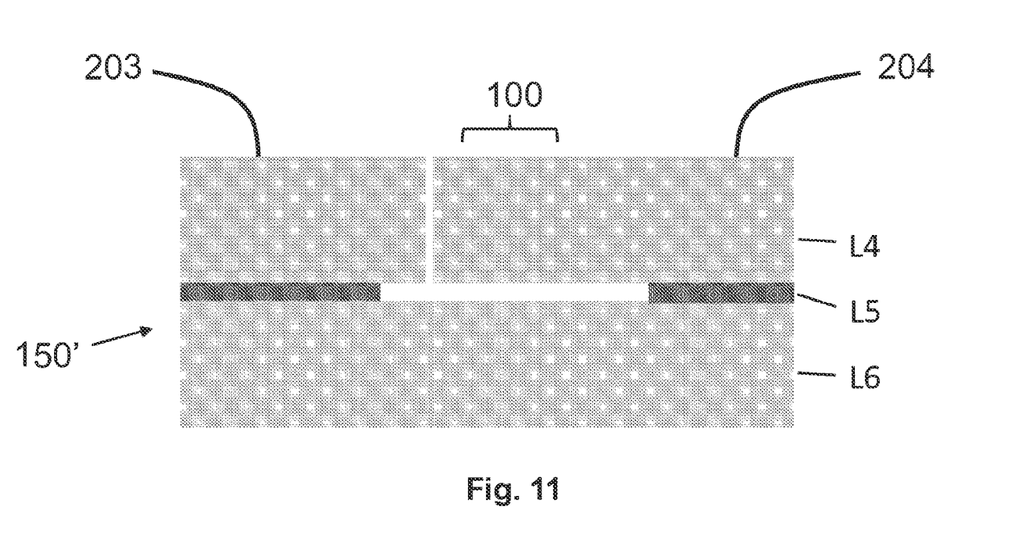
FIG. 11 shows a sectional view of an electrostatically actuated resonator in accordance with certain embodiments.

FIG. 11 shows an example cross section for electrostatic actuation. A silicon on insulator (SOI) wafer (herein denoted as 150') is applied. The reference numerals 203 and 204 denote the contacts to layer L4 with two different electrode potentials, respectively. Layer L4 is a doped silicon layer for the resonator body (beam elements and their connecting elements). The area of the resonator is denoted by 100. In between the resonator edge and the remaining layer L4 there is a gap that is used for electrostatic actuation. Layer L5 is a buried oxide layer of the SOI wafer, and layer L6 is a silicon handle layer.

The number of beam elements, and the number of connection elements in between the beam elements may vary depending on the embodiment. Accordingly, while the presented examples have shown 6 beam elements, the number of beam elements in a more general case differs from 6. The basic resonator structure, or resonator unit (stacked beam resonator) disclosed herein may be duplicated. For example, in certain embodiments a plurality of resonator units may be placed in parallel, or in series in certain embodiments. The basic resonator structure, instead of being anchored to its surroundings via its outermost beam elements, may be anchored via a non-outermost beam element (e.g., one or more inner beam elements). The anchoring to "surroundings" may be substituted by attaching to another resonator unit.

Figure 12:
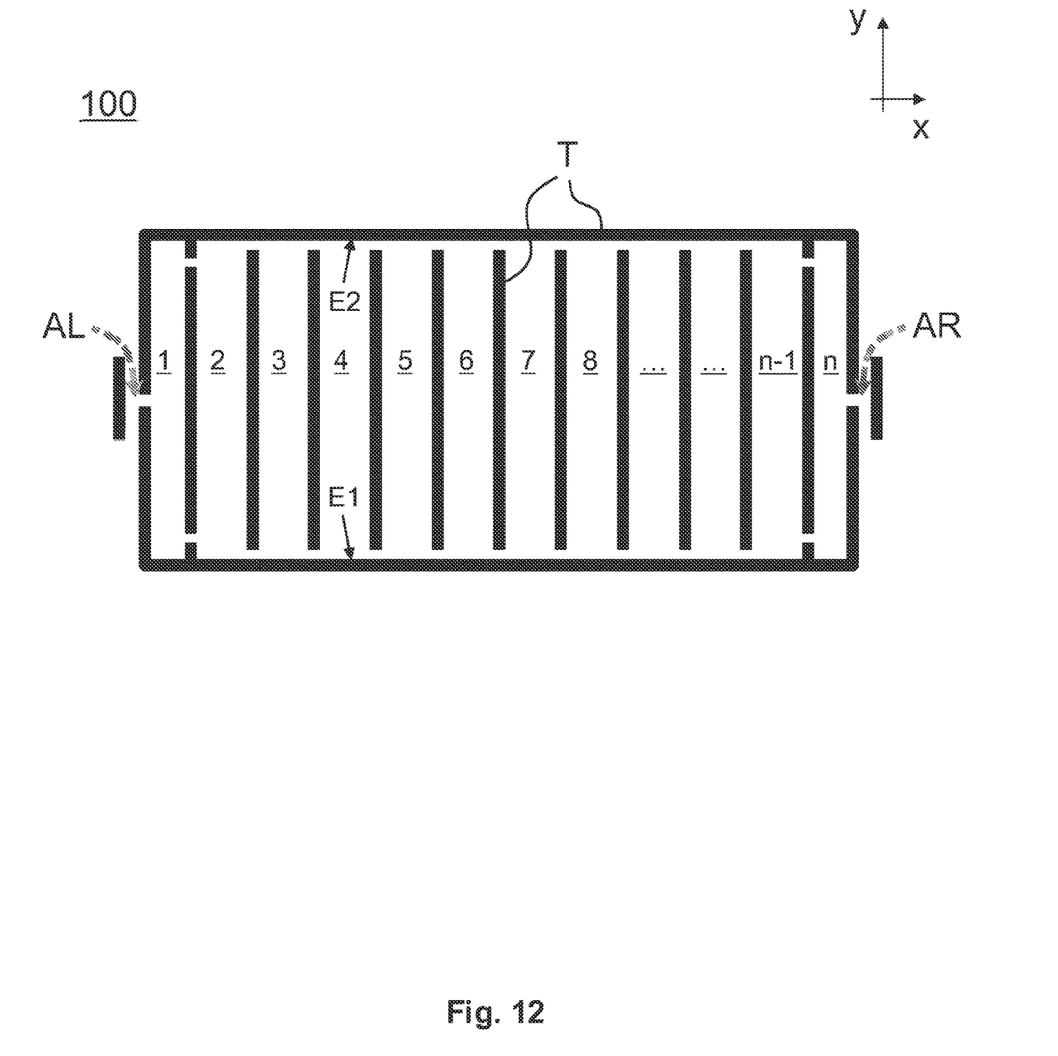
FIG. 12 further illustrates embodiments in which the resonator geometry varies within the resonator structure.

FIG. 12 further illustrates embodiments in which the resonator geometry varies within the resonator structure similarly as shown e.g. in FIGS. 1-3. The MEMS resonator 100 shown in FIG. 12 comprises a resonator structure having a plurality of elongated beam elements 1-$n$, where for example n=12. Each of the beam elements 1-$n$ are stacked beam elements positioned in parallel to each other forming a rectangular array configuration. Accordingly, the longitudinal axes of the beam elements 1-$n$ are in parallel. The shape of the beam elements 1-$n$ is preferably a rectangle. The center of mass of each beam element 1-$n$ is aligned along a single line (i.e., a single line passes through the center of mass of each of the beam elements 1-$n$). Each beam element 1-$n$ has preferably an equal length.

The resonator 100 is separated from its surroundings by a trench T circumventing the resonance structure. Similarly, each beam element 1-$n$ is separated from its adjacent beam element by a trench T. Each beam element 1-$n$ is also connected to its adjacent beam element by connection elements. Preferably, the number of beam elements between each adjacent pair of beam elements is two (i.e., the adjacent beam elements are connected to each other by exactly two connection elements). The resonator 100 is mechanically connected to its surroundings at the edges of the outermost beam elements. The location of the anchoring points is depicted by reference signs AL (left anchor, at the left edge of the resonator) and AR (right anchor, at the right edge of the resonator) in FIG. 12. Accordingly, the resonator 100 is preferably anchored to its surroundings (e.g., substrate) in a lateral direction of the outermost beam elements 1 and n at the middle of outer long sides of the outermost beam elements 1 and n.

The location at which the beam elements 1-$n$ meet the trench T at their first end (in y-direction) is denoted as edge E1 (front edge of the resonator) and a corresponding edge at the opposite end of the beam elements 1-$n$ as edge E2 (rear edge of the resonator).

In the example shown in FIG. 12 both the width of the beam elements and the location of the connection elements varies within the structure. In more detail, the outermost beam elements 1 and n have a width that is smaller than the width of the other beam elements. Preferably, the width of the first beam element 1 is equal to the width of the last beam element n, and the width of each of the remaining individual beam elements 2 to n−1 is mutually equal but larger than the width of beam element 1 (or n).

Further, each of the connection elements is positioned at zero distance from its closest outer edge E1 or E2 of the resonator, except for the connection elements that (are closest to the respective edge E1 or E2 and) connect the outermost and its adjacent beam element are spaced a distance apart from the respective edge E1 or E2 (or from respective ends of the adjacent beam elements 1-$n$ concerned). Accordingly, a straight borderline that runs along the edges E1 and E2 is discontinued at the point in between the outermost and its adjacent beam element. In that point, the trench T penetrates from the borderline level into in between the outermost and its adjacent beam element. Accordingly, the trench T extends from the resonator edge E1 or E2 to inside of the resonator structure until it reaches an edge of a spaced apart connection element concerned.

The resonator structure shown in FIG. 12 represents a symmetric resonator structure. It has mirror symmetry with respect to both central x-axis and central y-axis.

The beam elements of the resonator 100 are configured to vibrate in a (collective) length extensional (LE) resonance mode in their longitudinal direction (y-direction). The resonator structure comprises a piezoelectric layer for piezoelectric actuation of the resonator.

In preferable implementations of embodiments of the present disclosure, the resonator 100 is enclosed in a cavity at a low pressure in order to reduce energy losses due to gas damping. In practical implementations, however, the pressure surrounding the resonator may not be sufficiently low to reduce gas damping to a negligible level. In practical implementations of the present disclosure, it was observed that acoustic resonance may develop in the trench (T of FIG. 12) between the edges (E1 or E2 of FIG. 12) of the beams (or of the resonator) and a surrounding solidly mounted silicon frame. Several beam resonators according to embodiments of the present disclosure were fabricated and their resonance properties were characterized by electrical impedance measurements. The beam resonators included resonators with frequencies 40 MHz, 32 MHz, and 24 MHz. The widths of the trenches T between the edges E1 and E2 (with reference to FIG. 12) were 2 mm, 4 mm, 5.5 mm, 6 mm, 8 mm, 9 mm, 10 mm, 11 mm, 12 mm, 13 mm. Measurements carried out in the ambient pressure were analyzed for the trench width which yielded high Q factor and thereby low gas damping, defined as $T_{Low\ gas\ damping}$, and for the trench width which yielded low Q factor and thereby high gas damping, defined as $T_{High\ gas\ damping}$. The results for the trench widths could be fit with the empirical model equations $$T_{Low\ gas\ damping} = 4\ mm(40\ MHz/Freq)(n+\tfrac{1}{2})$$

and $$T_{High\ gas\ damping} = 4\ mm(40\ MHz/Freq)(n+1)$$

where "Freq" is the frequency of the beam resonator according to embodiments of the present disclosure and "n" is the integer number of acoustic wave lengths (n=0, 1, 2, . . . ).

Without limiting the scope and interpretation of the patent claims, certain technical effects of one or more of the example embodiments disclosed herein are listed in the following. A technical effect is providing optimized geometry of stacked beam resonators. A further technical effect is improved flexibility in MEMS resonator design.

The foregoing description has provided by way of non-limiting examples of particular implementations and embodiments of the present disclosure a full and informative description of the best mode presently contemplated by the inventors for carrying out the present disclosure. It is however clear to a person skilled in the art that the present disclosure is not restricted to details of the embodiments presented above, but that it can be implemented in other embodiments using equivalent means without deviating from the characteristics of the present disclosure.

Furthermore, some of the features of the above-disclosed embodiments of the present disclosure may be used to advantage without the corresponding use of other features. As such, the foregoing description should be considered as merely illustrative of the principles of the present disclosure, and not in limitation thereof. Hence, the scope of the aspects of the disclosed embodiments are only restricted by the appended patent claims.

The invention claimed is:

1. A microelectromechanical resonator, comprising:
a resonator structure having a plurality of beam elements and connection elements with certain geometry, wherein the plurality of beam elements are positioned adjacent to each other and adjacent beam elements are mechanically connected to each other by the connection elements at both ends, and
wherein the geometry of the beam elements or the connection elements varies within the resonator structure.

2. The resonator of claim 1, wherein said plurality of beam elements is positioned in a rectangular array configuration, and wherein the resonator structure comprises a top electrode implemented in a layer on top of a piezoelectric layer.

3. The resonator of claim 1, wherein a beam element differs in width from another beam element.

4. The resonator of claim 1, wherein a beam element differs in shape from another beam element.

5. The resonator of claim 1, wherein a beam element differs in tilting angle from another beam element.

6. The resonator of claim 1, wherein a beam element differs in its longitudinal position within the resonator structure from another beam element.

7. The resonator of claim 1, wherein a connection element differs in its shape from another connection element.

8. The resonator of claim 1, wherein a connection element differs from another connection element in its displacement from resonator edge.

9. The resonator of claim 1, wherein a width of at least one beam element differs from a width of another beam element and at least one of the connection elements connecting adjacent beam elements is spaced a distance apart from respective ends of the adjacent beam elements concerned.

10. The resonator of claim 1, wherein a width of an outermost beam element is smaller than the width of its adjacent beam element.

11. The resonator of claim 1, further comprising a trench extending from a resonator edge to inside of the resonator structure until it reaches an edge of one of the connection elements.

12. The resonator of claim 1, further comprising an anchoring point to anchor beam elements to surroundings, where a main resonance mode shape of the resonator has a nodal point at the anchoring point.

13. The resonator of claim 1, wherein the beam elements are of an elongated shape, such as a rectangular shape, rounded rectangular shape, rounded elliptical shape, an hourglass shape, a tapered shape, a rotated hourglass shape, or a non-symmetric elongated shape.

14. The resonator of claim 1, wherein at least one connection element differs from another connection element.

15. The resonator of claim 1, wherein the beam elements of the resonator are configured to operate in an in-plane length extensional mode.

16. The resonator of claim 1, wherein the resonator structure of the resonator having the plurality of beam elements and the connection elements is a symmetric structure.

17. The resonator of claim 1, wherein the resonator structure comprises asymmetry in the form of at least one of the connection elements being asymmetrically positioned.

18. The resonator of claim 1, wherein the resonator comprises semiconducting material and/or silicon and/or degenerately doped silicon, and/or more than 50% of the resonator mass consists of degenerately doped silicon, and/or the resonator comprises a body of silicon doped to an average impurity concentration of at least $2*10^{19}$ cm$^{-3}$, such as at least $10^{20}$ cm$^{-3}$.

19. The resonator of claim 1, wherein a longitudinal axis of a beam element is aligned with [100] crystal direction of the beam element, or deviates less than 25 degrees, or less than 15 degrees, or less than 5 degrees, or less than 2 degrees, therefrom.

20. The resonator of claim 1, further comprising a width of a trench between edges of the beam elements forming the resonator and a surrounding solidly mounted silicon frame selected so as to minimize or avoid acoustic resonance at the area of the trench.

21. The resonator of claim 1, wherein a width of a trench between edges of the beam elements forming the resonator and a surrounding solidly mounted silicon frame is given by the equation Trench–Width=4 μm×(40 MHz/Freq)×(n+½) within +/−20% and where "Freq" is the frequency of the resonator, and "n" is 0, 1, 2, 3, . . . .

* * * * *